United States Patent
An et al.

(10) Patent No.: US 11,445,632 B1
(45) Date of Patent: Sep. 13, 2022

(54) APPARATUS FOR MAINTAINING AIRFLOW WHILE SERVICING COMPONENT

(71) Applicant: ZT Group Int'l, Inc., Secaucus, NJ (US)

(72) Inventors: Chen An, Bergenfield, NJ (US); Asim Huda, Edison, NJ (US); Ting-Yu Lin, Fairfield, NJ (US); Haiyan Luo, Monroe Township, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 87 days.

(21) Appl. No.: 17/177,868

(22) Filed: Feb. 17, 2021

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |
| *H05K 5/02* | (2006.01) |
| *H05K 7/14* | (2006.01) |

(52) U.S. Cl.
CPC ....... *H05K 7/20136* (2013.01); *H05K 5/0239* (2013.01); *H05K 7/1418* (2013.01)

(58) Field of Classification Search
CPC ............ H05K 7/20136; H05K 7/1418; H05K 7/20172; H05K 7/2019; H05K 7/202; H05K 7/20209; H05K 7/20; H05K 5/0239; H05K 5/0217; H05K 5/0221; H05K 5/0226; H05K 5/023
See application file for complete search history.

(56) References Cited

U.S. PATENT DOCUMENTS

| | | | | | |
|---|---|---|---|---|---|
| 4,771,365 | A | * | 9/1988 | Cichocki | H05K 7/1421 361/705 |
| 5,999,365 | A | * | 12/1999 | Hasegawa | G11B 33/1493 361/679.48 |
| 7,911,788 | B2 | * | 3/2011 | Sasagawa | G06F 1/20 165/104.34 |
| 8,305,751 | B2 | * | 11/2012 | Merrow | G11B 33/08 439/60 |
| 9,854,714 | B2 | * | 12/2017 | Shedd | H05K 7/20809 |
| 10,237,965 | B2 | * | 3/2019 | Luskind | G06F 1/182 |
| 10,624,223 | B1 | * | 4/2020 | Tsorng | H05K 7/20727 |
| 2009/0265043 | A1 | * | 10/2009 | Merrow | G11B 33/128 700/299 |
| 2015/0230366 | A1 | * | 8/2015 | Shedd | H05K 7/20809 165/84 |

(Continued)

*Primary Examiner* — Anthony M Haughton
(74) *Attorney, Agent, or Firm* — Dergosits & Noah LLP; Todd A. Noah

(57) ABSTRACT

Embodiments promote the maintenance of a designed flow of cooling air through a chassis during the servicing of one or more electronic components contained by the chassis. A top opening created by the removal of server chassis from a rack may be significantly reduced by internal lids that provide access to groups of components. Gaps created by the partial removal of groups of components may be significantly reduced by air dams attached to the components that inhibit the flow of air between the components. And the opening created by the removal of a circuit board may be significantly reduced by a flap configured to cover the opening upon removal of the circuit board. The various embodiments may be used individually or in combination to reduce openings in the chassis that may allow air to flow in paths that negatively affect the designed air flow.

13 Claims, 15 Drawing Sheets

(56) References Cited

U.S. PATENT DOCUMENTS

2018/0124954 A1* 5/2018 Zebian .............. H05K 7/20736
2022/0110225 A1* 4/2022 Edmunds ........... H05K 7/20772
2022/0201896 A1* 6/2022 Edmunds ........... H05K 7/20263

* cited by examiner

APPARATUS FOR MAINTAINING AIRFLOW WHILE SERVICING COMPONENT

BACKGROUND

In housings that hold a number of heat-generating electronic devices, e.g., servers where there are a large number of HDDs, it is important to implement effective thermal solutions that help maintain airflow to effectively cool all of the components. In such servers, cold air will usually enter from the front of the chassis and make its way to the rear while cooling down all of the components on its way. As this air flows through the system, it will absorb heat from the different components until it finally reaches the rear of the chassis where powerful fans will exhaust the hot air out of the system.

During the process of cooling a server and all of its components, to make the system more efficient, it is preferable to maintain airflow by preventing air from escaping prematurely from the housing (in the case of fans positioned at the entry of the housing), or from entering the housing at undesignated sites (in the case of housings with exhaust fans). That is, with servers it is preferable to maintain airflow even as different components are being serviced.

However, when designing a server, engineers will often only consider the airflow in the system under the assumption that everything is already installed in the housing and the housing is in place within the rack. Thus, when the user services or removes a device, e.g., an HDD from the system, it will create an opening that allows air to bypass the designed cooling flow path.

Also, after the user removes the device, the user may want to service the circuit board associated with the device at the base of the server. For example, an HDD back plane (BP) board is usually mounted to a tray that can slide out from the side of the server for service. Sliding out such an HDD BP tray from the server may also create an opening that allows air to bypass the designed cooling flow path and result in a loss of efficiency.

Thus, what is needed is an apparatus that reduces improper airflow in a housing (alternatively a "chassis") when components and devices are being serviced.

BRIEF DESCRIPTION OF THE DRAWINGS

The embodiments are illustrated by way of example and not limitation in the accompanying drawings, in which like references indicate similar elements, and in which.

DETAILED DESCRIPTION

Figure 1:
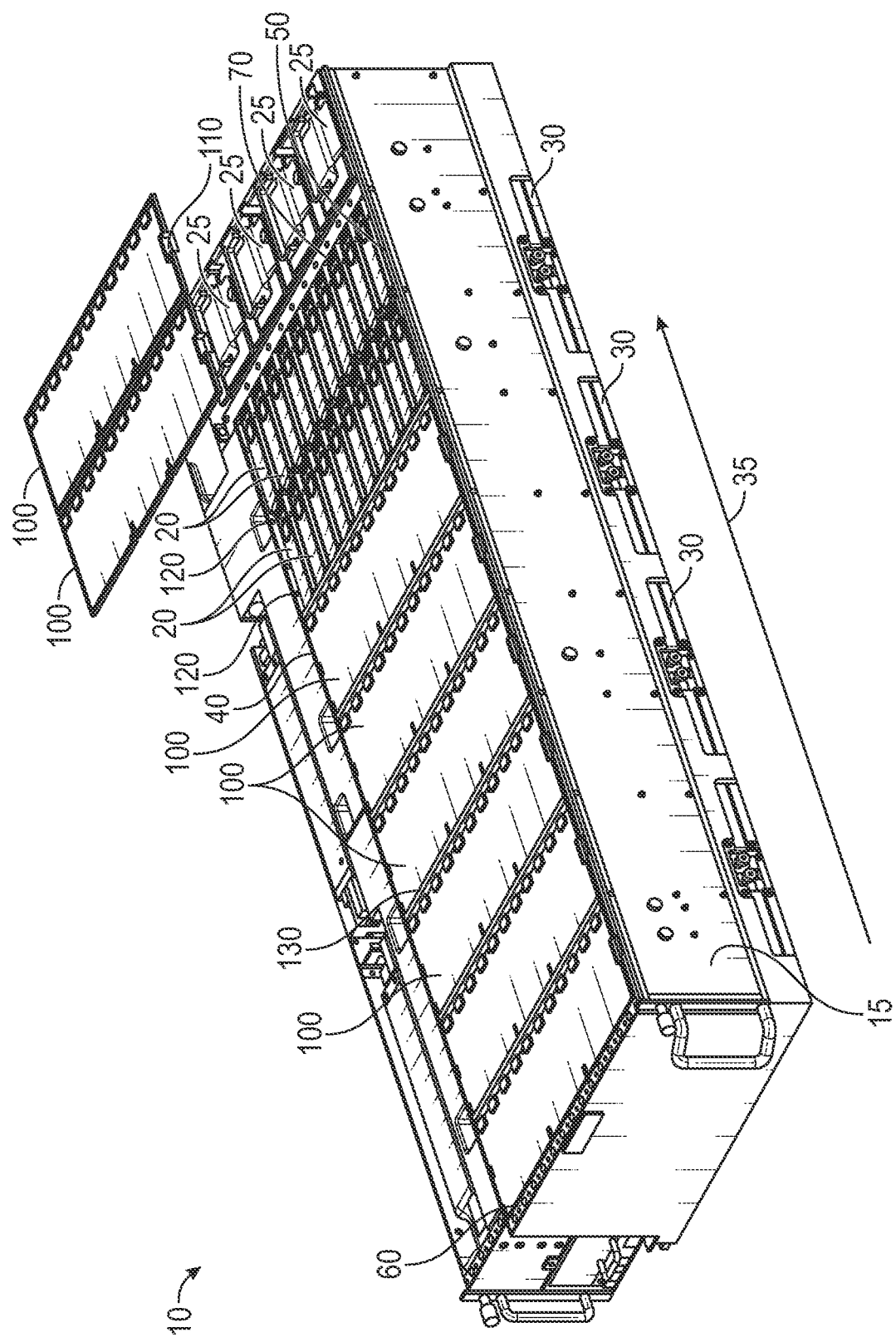
FIG. 1 is a perspective view of an embodiment for reducing improper airflow in a housing.

In embodiments, which may be used singly or in combination, a goal is to promote proper airflow through the system even as different components are being serviced. Embodiments are generally directed to covering openings that may occur when an electronic device (e.g., an HDD) or other component (e.g., a circuit board) is being serviced to minimize the area of the opening through which air may pass. For example, when a circuit board or other component is removed and the cooling system uses an exhaust fan, the opening left by the removed component would allow air to be drawn into the housing, which would potentially reduce the proper flow of cooling air elsewhere through the housing. In addition, when a circuit board is removed and the cooling system uses a fan blowing cooling air into the housing, the opening left by the removed circuit board would allow air to escape from the housing, which would also potentially reduce the proper flow of cooling air elsewhere through the housing.

In an embodiment, when a housing is removed (i.e., slid out of the rack) for service of an internal component, the uncovered top of the housing may allow undesired airflow into, or out of, the housing. For example, small openings between HDDs allow hot external air to be drawn in between the HDDs. In the embodiment, a layer of lids is disposed over the components below the cover to decrease or eliminate the effective area of the flow path created by the opening. Each lid may be detached from the housing to service the components below that lid. Thus, the area of the opening created by the removal of the housing for the service of a subset of the components within the housing is decreased.

If a single electronic component is to be serviced, the housing may be removed to reveal a layer of lids as discussed above. A lid covering a plurality of removable components may be detached to provide access to one of the many removable components beneath the lid. In an embodiment, each of the many removable components may be provided with a bar or "air dam" on one side of the component that reduces a flow path between that component and a next component or side of the housing. Thus, in the embodiment, a single row of components may be raised for service of, e.g., the back plane. Without the bars (air dams), the removal of the lid creates a flow path for an undesired airflow. However, the components of the plurality and associated bars between components work to reduce or eliminate flow between the raised components.

If a circuit board below a plurality of electronic components is to be serviced, the housing may be removed from the rack, revealing a layer of lids as discussed above. One or more lids covering the plurality of removable components associated with the circuit board may be detached. The plurality of components may then be disconnected and raised so that connections to the circuit board are cleared to allow removal of the circuit board. At this point, the components of the plurality and associated bars between components work to reduce or eliminate flow between those components. However, when the circuit board is removed from the housing, the removal may leave an open slot in the side of the housing that creates a flow path for an undesired airflow. In an embodiment, a flap covers the opening in the side of the housing upon removal of the circuit board. Thus, in the embodiment, the flap works to reduce or eliminate flow through an opening in the housing created by the removal of the circuit board.

In the embodiments described above, the plurality of removable components may be, e.g., HDDs. However, the removable components may also be other devices without departing from the teaching of this specification. Also, the plurality may be a plurality of like devices, or of different devices. Similarly, the component removed from the beneath the plurality of devices and out the side of the housing may be, e.g., a circuit board. However, that component may also be other components without departing from the teaching of this specification.

Thus, singly and in combination, the several embodiments work to limit undesired air flow and promote the designed airflow, even when electronic devices or associated circuit boards are being serviced.

FIG. 1 is a perspective view of an embodiment of a lid 100 for reducing improper airflow in a housing. In FIG. 1, an exemplary apparatus, i.e., a server 10, has been removed from a rack. Two removable lids 100 have been displaced to reveal pluralities of exemplary electronic devices, i.e., HDDs 20. HDDs 20 are shown installed in the interior space of the chassis and connected to circuit board (402, FIG. 4), the position of which is indicated by an installed back plane (BP) tray 30. With server 10 properly installed in a rack, a designed, cooling airflow enters through a vent (not shown, or a plurality of vents) at the front of chassis 15, flows through devices 20, and is exhausted out the rear of chassis 15 by fans 25.

Two of lids 100 are shown detached from chassis 15. The detached lids reveal that air may be drawn into chassis 15 between exposed electronic devices 20, thus reducing the designed flow of cooling air through the upstream section of chassis 15. In the embodiment, lids 100 are attached to chassis 15 to cover the potential flow path that is exposed by the removal of the housing from the rack. Lids 100 may be connected to chassis 15 at one side by a clasp 110 that engages a slot 210 (FIG. 2) in edge 50, and connected by feet 320 (FIG. 3A) inserted into slots 120 on edge 40.

In the embodiment, lids 100 are dimensioned to attach to and span between chassis edges 40 and 50. Lids 100 are also dimensioned to collectively span between chassis front edge 60 and rear edge 70. With chassis edges 40, 50, 60, and 70 defining the potential path for unwanted air to flow that is caused by the removal of the housing from the rack, lids 100 cooperate to cover that same area and reduce or eliminate the size of the potential path. In an embodiment, each lid 100 may abut its adjacent lid(s) 100 at a seam (130), or abut an edge 60, 70 to completely seal against the adjacent lid or edge. In an embodiment, each lid 100 may approach but not directly abut its adjacent lid 100 at seam 130 or edge 60, 70 to incompletely seal against the adjacent lid or edge, depending on the requirements of the designer.

Figure 2:
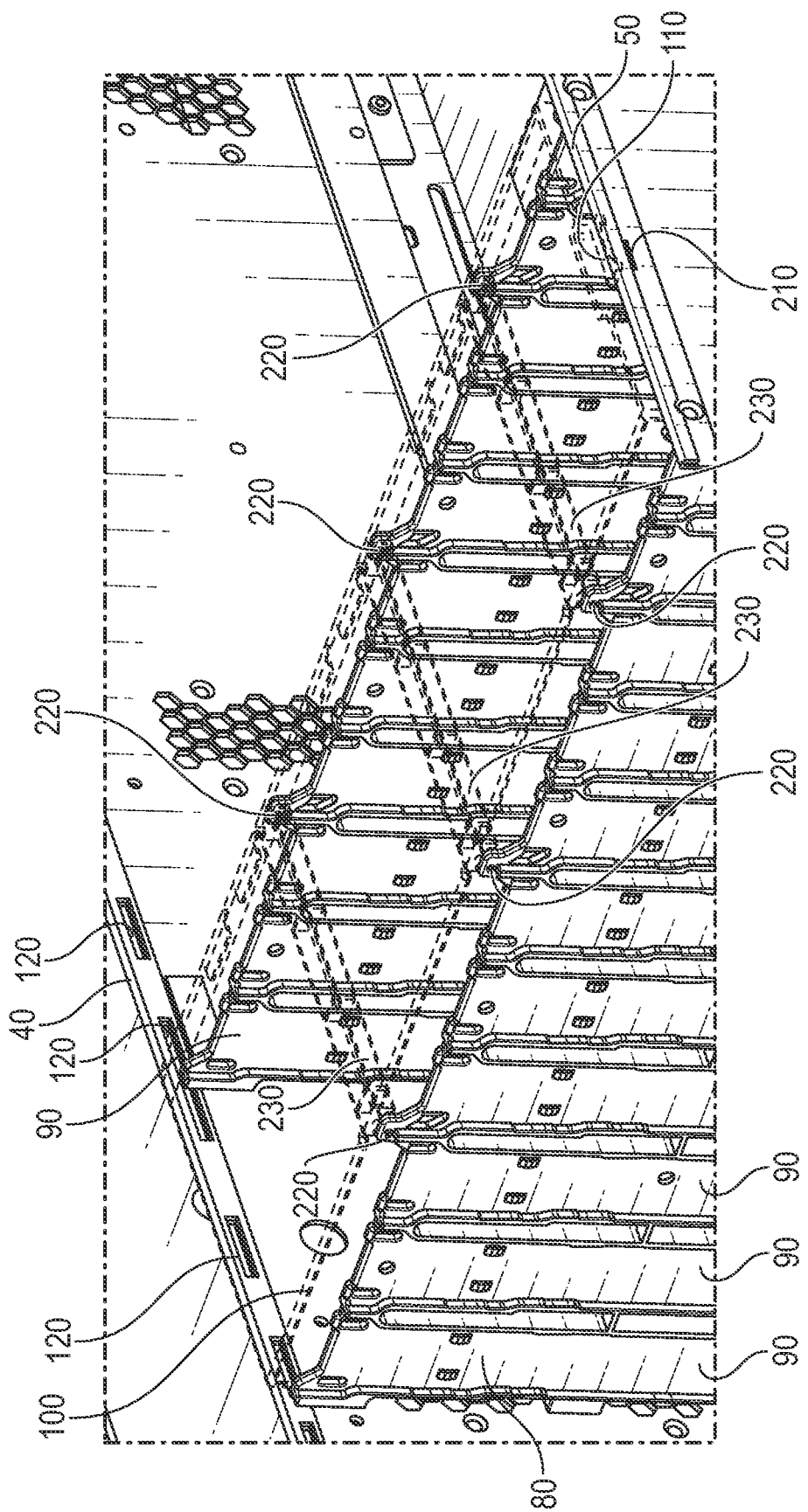
FIG. 2 is a partially transparent perspective view of elements of an embodiment for reducing improper airflow in a housing.

FIG. 2 is a partially transparent perspective view of elements of an embodiment for reducing improper airflow in a housing. In FIG. 2, lid 100 is shown partially transparent to facilitate discussion of elements beneath. Lid 100 is attached to and spans between chassis edges 40, 50. Within the interior space of chassis 15, two partitions 80 define positions between them for a plurality of electronic devices 20, where a single device 20 slides down between partitions 80 following tracks 90. In between the tracks 90 on partition 80, there are large openings for air to flow through. The large opening provide a path for proper airflow between each of the HDDs in direction 35. There are similar partitions 90 (not shown) at the very front and very rear next to edges 60 and 70. FIG. 2 illustrates clasp 110 engaging slot 210 within edge 50 to releasably retain lid 100. Slots (or slits or recesses) 120 receive feet 320 (shown in FIG. 3). In an embodiment, lid 100 includes a stiffener or beam 230 and is attached to each partition 80 by a snap 220 attached to beam 230. In the embodiment, the attachments to partitions 80 and beams 230 work to prevent deformation of lid 100 that may be created by internal vacuum (due to exhaust fans) or internal pressure (due to pressurizing fans). However, beams 230 and snaps 220 may not be provided depending on the design and materials chosen for lid 100.

Figure 3A:
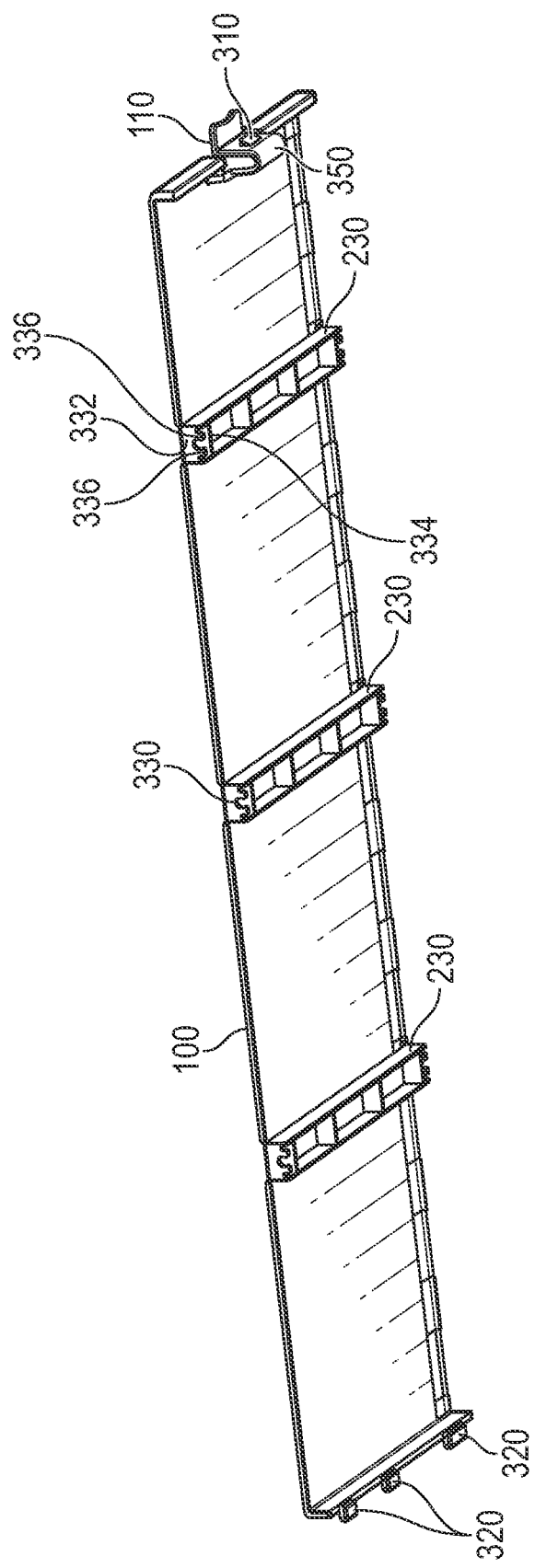
FIG. 3A-FIG. 3D are perspective views of elements of an embodiment for reducing improper airflow in a housing.
Figure 3B:
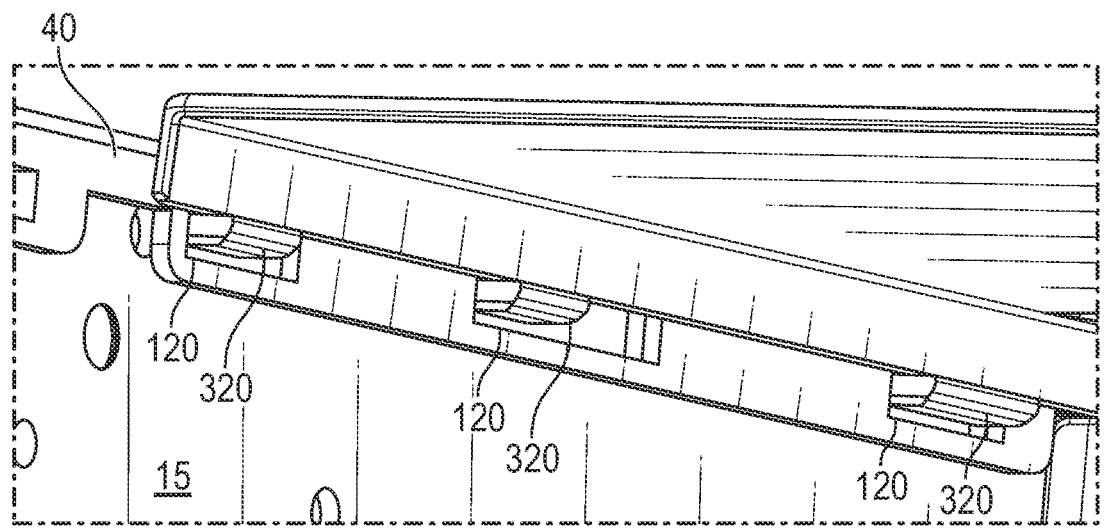
Figure 3C:
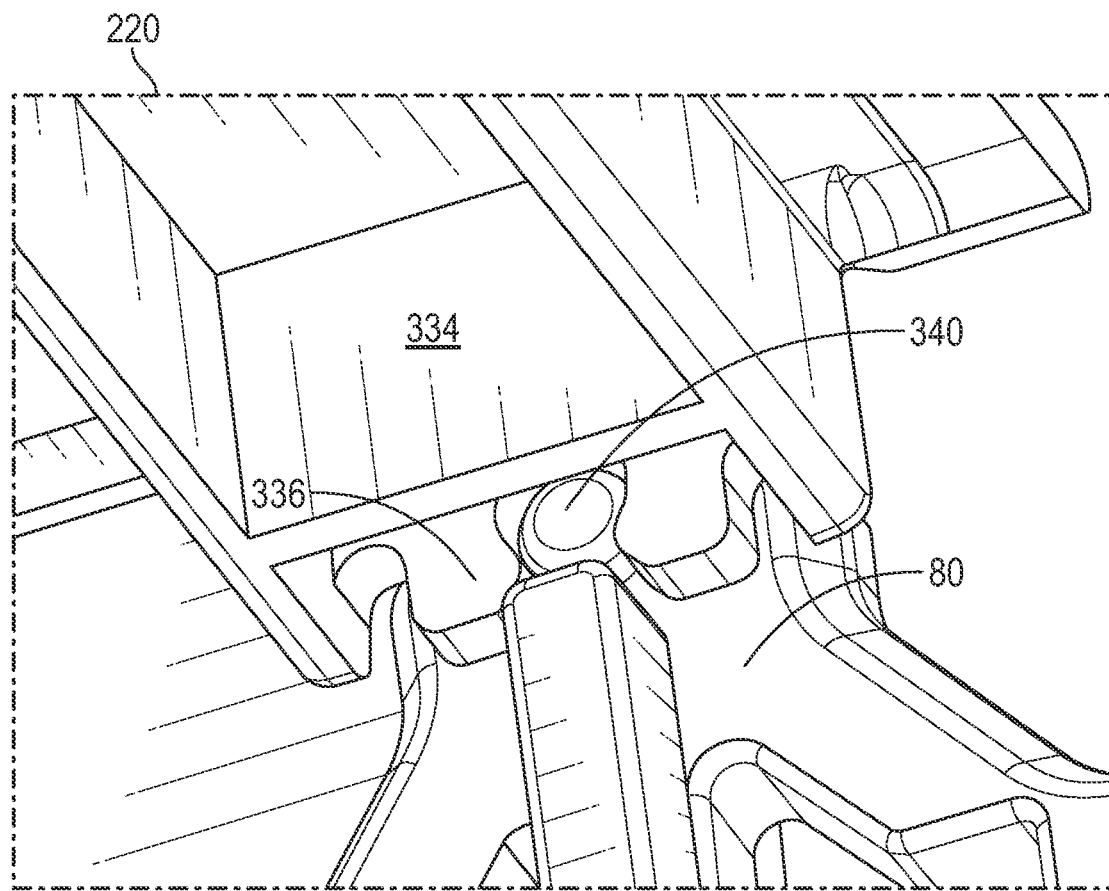

FIG. 3A-FIG. 3D are perspective views of elements of lid 100. In FIG. 3A, exemplary potential configurations are shown for snaps 220, beams 230, clasp 110, and feet 320. Clasp 110 may include a tooth 310 disposed on a flexible plastic feature 350 (FIG. 3D) and positioned to engage slot 210. Elements of snap 220 associated with lid 100 may include a receiver 330. Receiver 330 may include a flat section 332 recessed slightly from an edge of lid 100. Lobes 336 of flat section 332 may be deformable to admit entry of a pin 340 (FIG. 3C). A cross-beam 334 behind lobes 336 may provide additional stiffness.

FIG. 3C illustrates snap 220 from underneath lid 100 when connected to partition 80. In FIG. 3C, lobes 336 have deformed to removably admit pin 340 attached to partition 80, thus attaching lid 100 to partition 80.

FIG. 3B illustrates the attachment of lid 100 to chassis 15 at edge 40. In FIG. 3B, feed 320 have been inserted into slits 120.

Figure 3D:
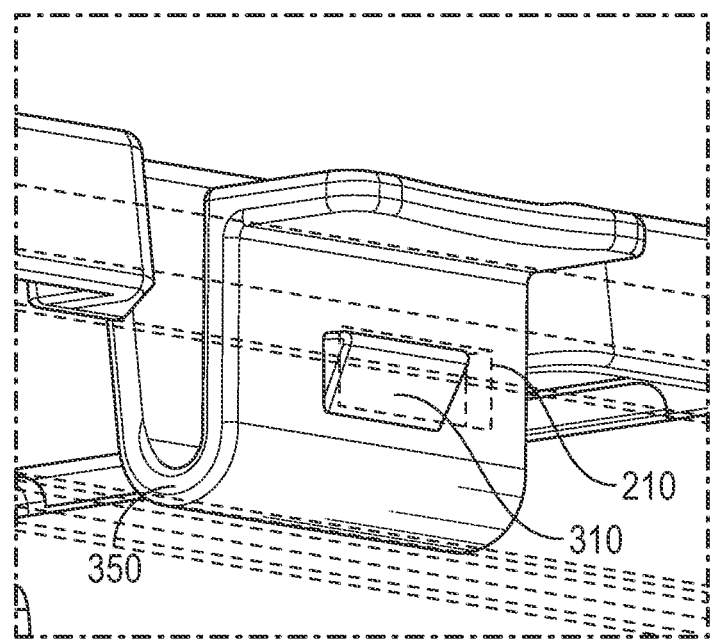

FIG. 3D illustrates the attachment of lid 100 to chassis 15 at edge 50. In FIG. 3D, tooth 310 of clasp 110 has been inserted into slot 210. Tooth 310 may be displaced from slot 210 by deforming flexible plastic feature 350.

Elements of lid 100 may be fashioned from a suitable material, such as a plastic or metal, depending on the design requirements, and that individual elements of lid 100 may be fashioned from the same materials as the main flat surface of the body, or from different materials, depending on the design requirements.

Figure 4:
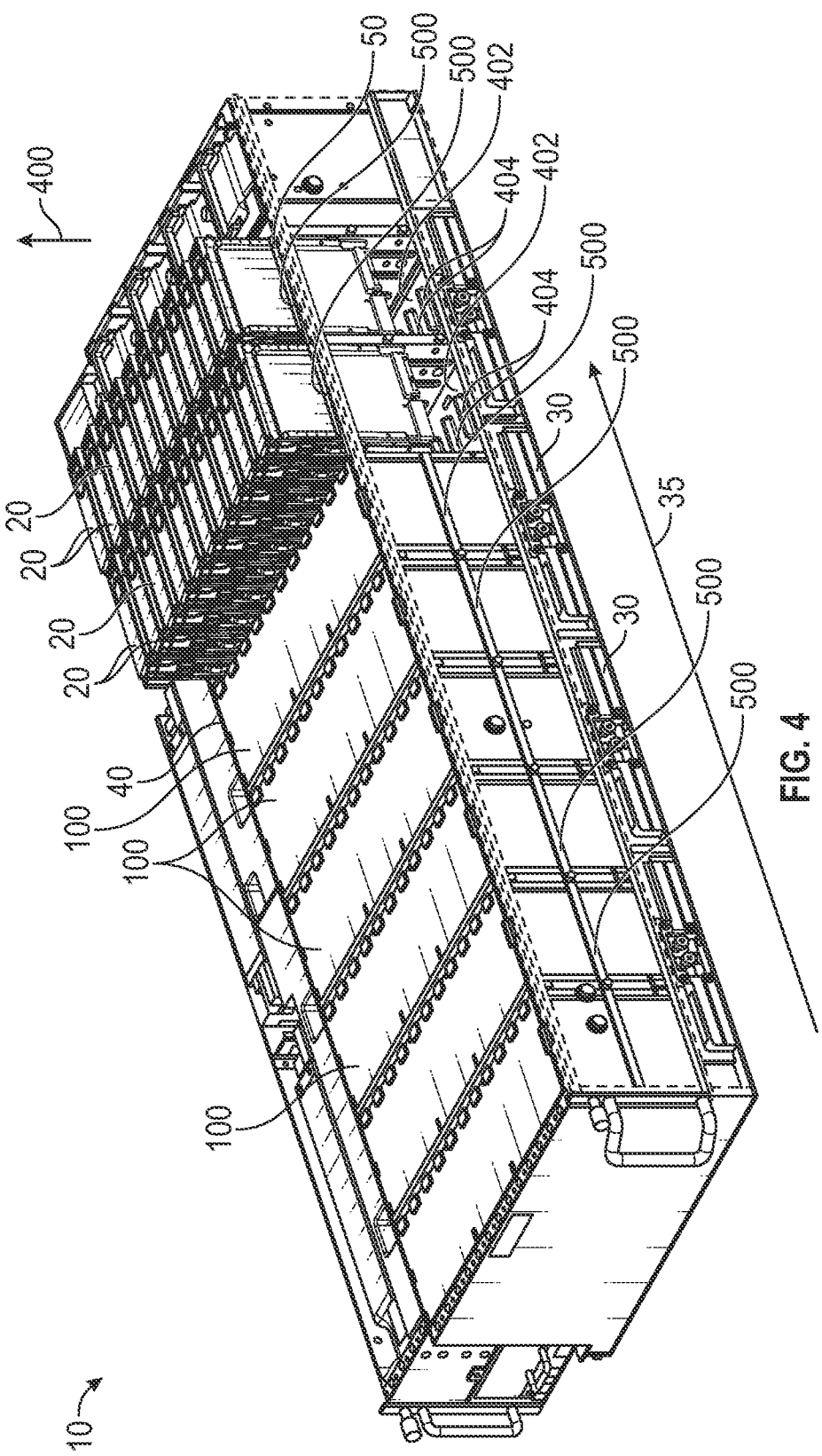
FIG. 4 is a partially transparent perspective view of an embodiment for reducing improper airflow in a housing.

FIG. 4 is a partially transparent perspective view of an embodiment for reducing improper airflow in a housing. In FIG. 4, the right side of chassis 15 beneath edge 50 has been rendered transparent to reveal electronic devices 20 equipped with bars (or "air dams") 500. In the embodiment, bars 500 are attached to a side of each device 20 and dimensioned to span from the attached device 20 to an adjacent device 20 or chassis 15. Thus, bars 500 reduce the area between devices 20 or device 20 and chassis 15 through which undesired airflow may occur (e.g., direction 400, or the reverse of direction 400 (for an exhaust fan)). When devices 20 are shown installed within chassis 15 and covered by lids 100, bars 500 are redundant to lids 100 in preventing airflow in direction 400. However, for the two hind-most rows of devices 20, lids 100 have been removed and devices 20 disconnected from connections 404 on circuit board 402. Devices 20 have also been raised from board 402 until bars 500 are even with edge 50. In this position, raised devices 20 and their associated bars 500 work to prevent airflow into chassis 15 in the direction 400 or the reverse. In this raised position, a single device 20 may be removed and serviced. The removal of the lid and also the removal of the single component does create a a flow path for an undesired airflow in direction 400 or the reverse.

However, the remaining devices 20 and associated bars 500 between those devices work to reduce or eliminate flow between those remaining components. In an embodiment, bars 500 may be dimensioned to completely fill the gap between devices 20 or device 20 and chassis 15, such that bar 500 abuts the adjacent device 20 or chassis 15. In an embodiment, bars 500 may be dimensioned to approach but not directly abut adjacent device 20 or chassis 15 to incompletely seal, depending on the requirements of the designer.

Figure 5:
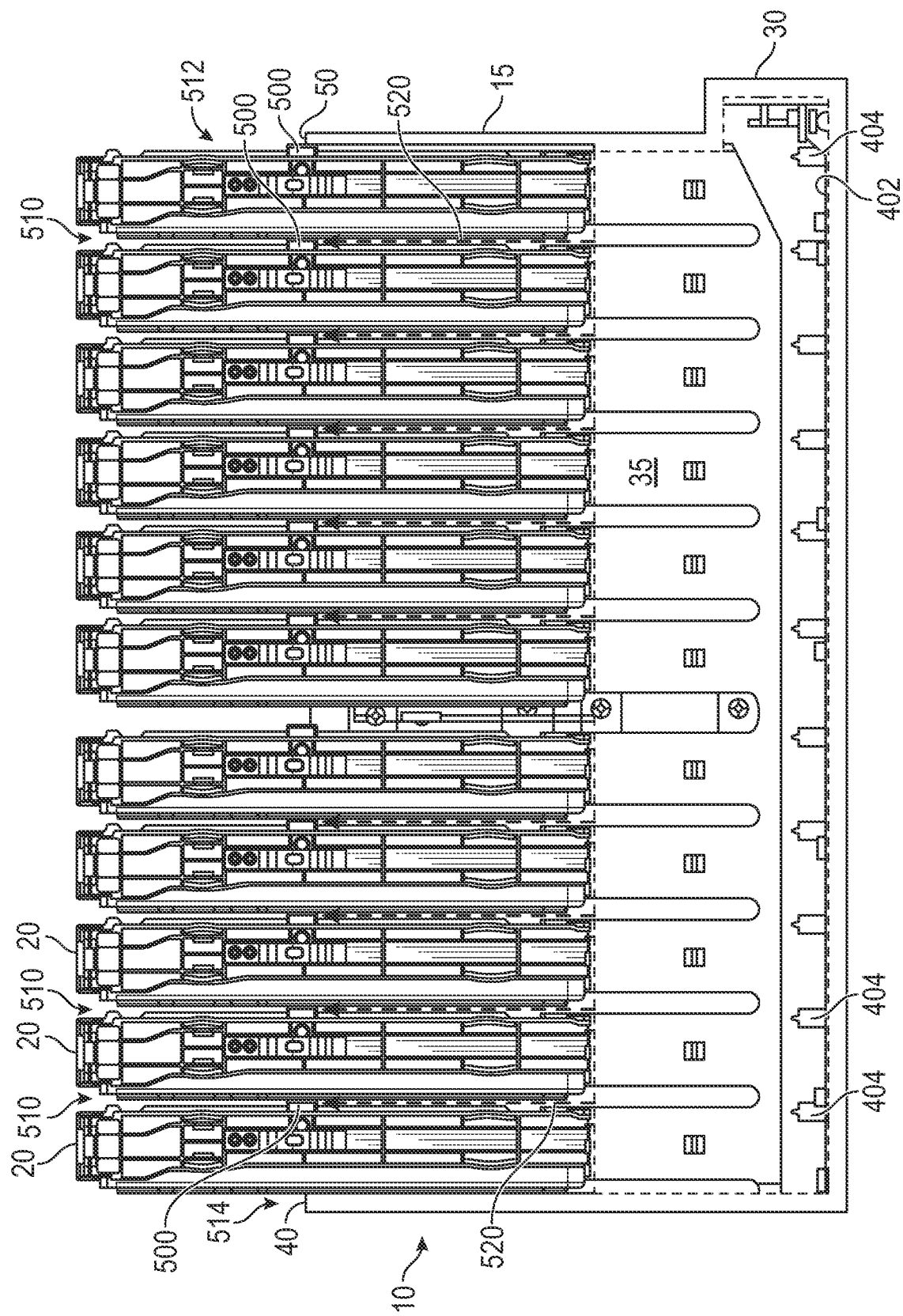
FIG. 5 is a front, sectional view of an embodiment for reducing improper airflow in a housing.

FIG. 5 is a front, sectional view of an embodiment for reducing improper airflow in a housing. In FIG. 5, design airflow in direction 35 (into the page) is depicted by a dashed outline with arrow that extend up to bars 500. Devices 20 have been raised from board 402 until bars 500 are level with edges 40, 50. FIG. 5 further illustrates that bars 500 reduce or eliminate a flow path 510 between devices 20, and a flow path 512 between the right-most device 20 and edge 50. A flow path 514 between the left-most device 20 and edge 40 is shown not equipped with a bar, as an example of a path that has been determined to allow de minimis airflow. One of skill will understand that path 514, if larger or otherwise undesired, could be inhibited by an additional bar 500. Thus, FIG. 5 illustrates an embodiment employing bars 500 to allow the raising of devices 20 without unacceptable loss of airflow 35. That is, an actual flow 520 of air through each of paths 510 has been determined to be acceptable.

Figure 6:
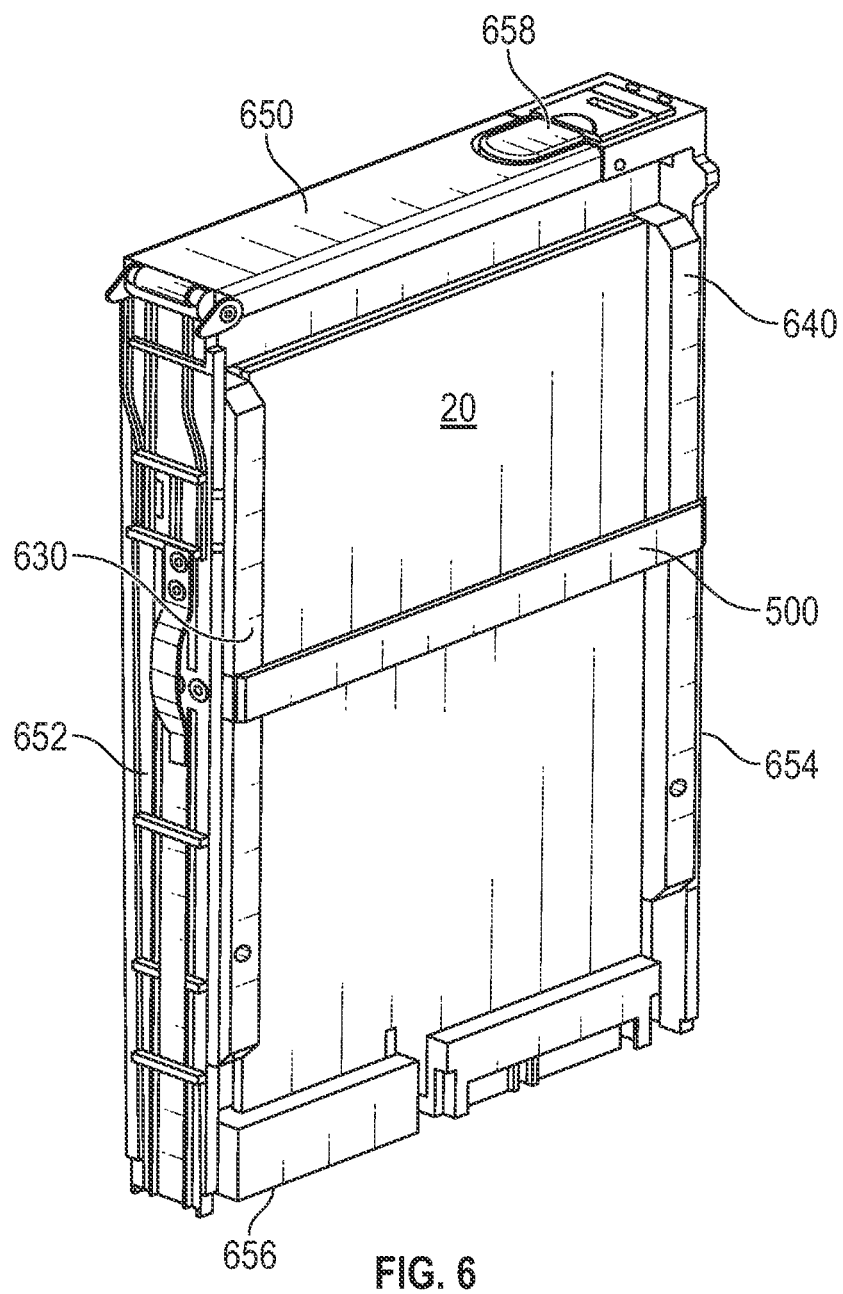
FIG. 6 is a perspective view of an embodiment for reducing improper airflow in a housing.

FIG. 6 is a perspective view of an embodiment for reducing improper airflow in a housing. In FIG. 6, electronic device 20 is contained within a carrier 650 that includes sides 652, 654, base 656, and an upper entry and latch 658. Device 20 includes rails 630 and 640 on a first side of device 20. Bar 500 is shown attached to sides 652, 654, and spans rails 630, 640. Bar 500 is configured to extend toward device 20, between rails 630, 640, such that there is no space for air flow between device 20 and bar 500. In this manner, bar 500 may be considered attached to device 20.

Figure 7A:
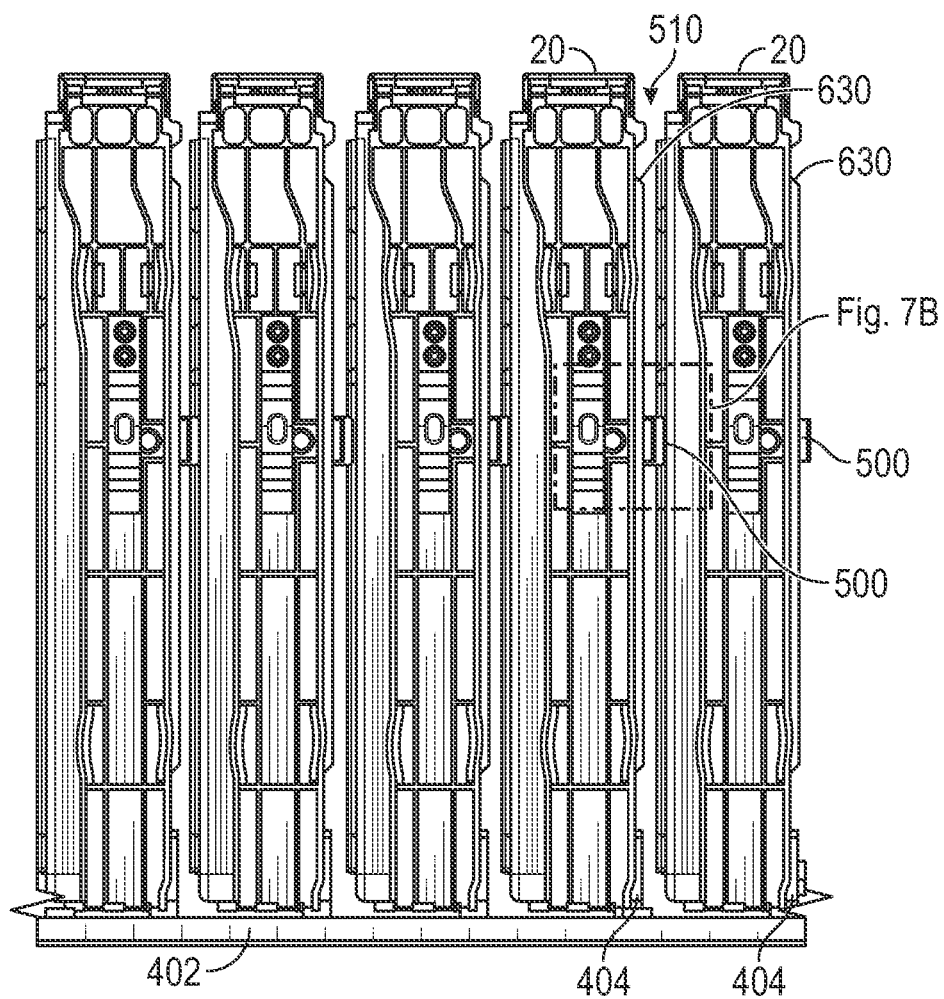
FIGS. 7A and 7B are front, sectional views of an embodiment for reducing improper airflow in a housing.
Figure 7B:
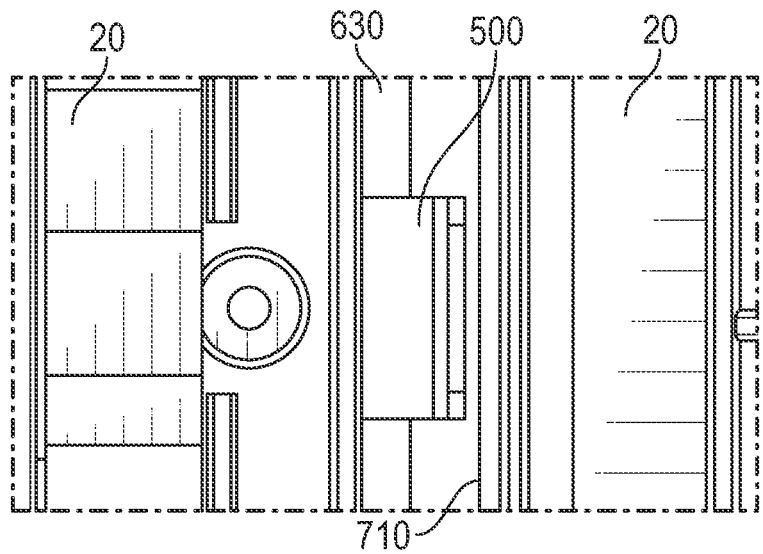

FIGS. 7A and 7B are front, sectional views of an embodiment for reducing improper airflow in a housing. FIG. 7A depicts flow path 510 between devices 20. FIG. 7B shows an enlarged section of FIG. 7A. In FIG. 7B, bar 500 is shown to approach, but not abut, a side 710 of the adjacent device 20. Thus, bar 500 reduces but does not completely eliminate flow path 510. In an embodiment, bar 500 may be dimensioned to abut side 710 and completely eliminate flow path 510.

Figure 8A:
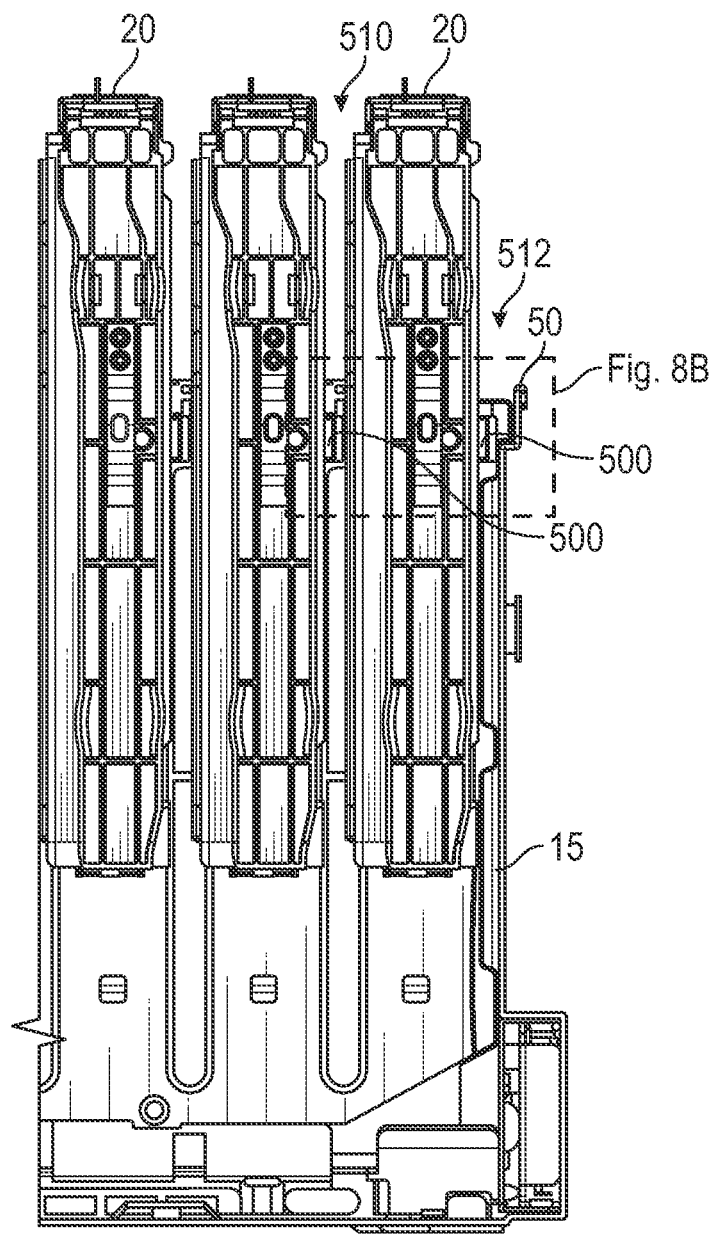
FIGS. 8A and 8B are front, sectional views of an embodiment for reducing improper airflow in a housing.
Figure 8B:
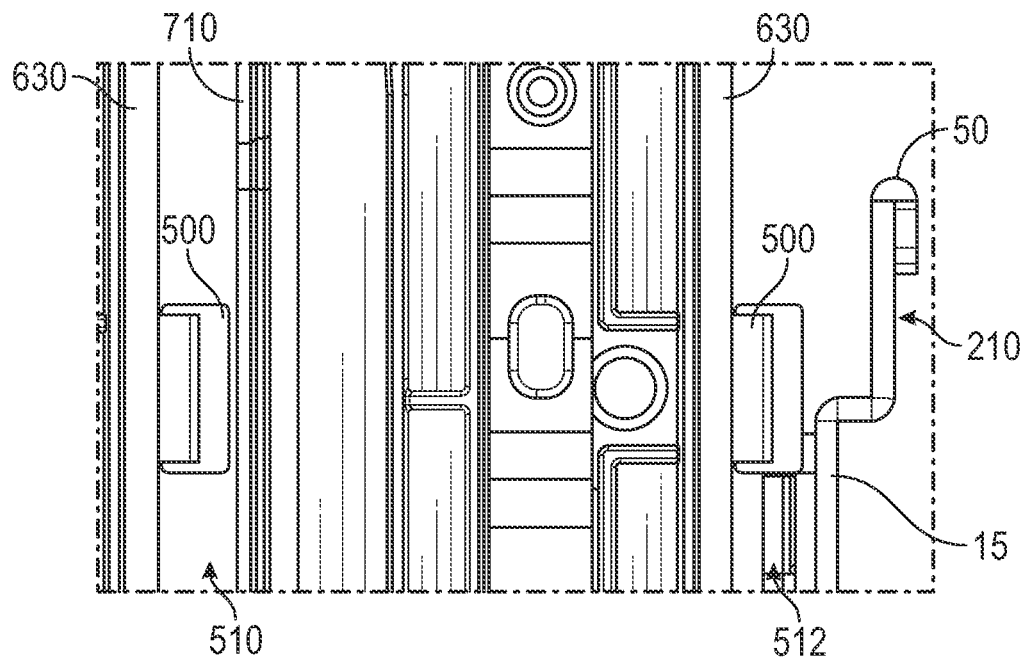

FIGS. 8A and 8B are front, sectional views of an embodiment for reducing improper airflow in a housing. FIG. 8A depicts flow path 512 between device 20 and edge 50. FIG. 8B shows an enlarged section of FIG. 8A. In FIG. 8B, bar 500 is shown to approach, but not abut, edge 50 of chassis 15. Thus, bar 500 reduces but does not completely eliminate flow path 512. In an embodiment, bar 500 may be dimensioned to abut edge 50 and completely eliminate flow path 512.

Figure 9A:
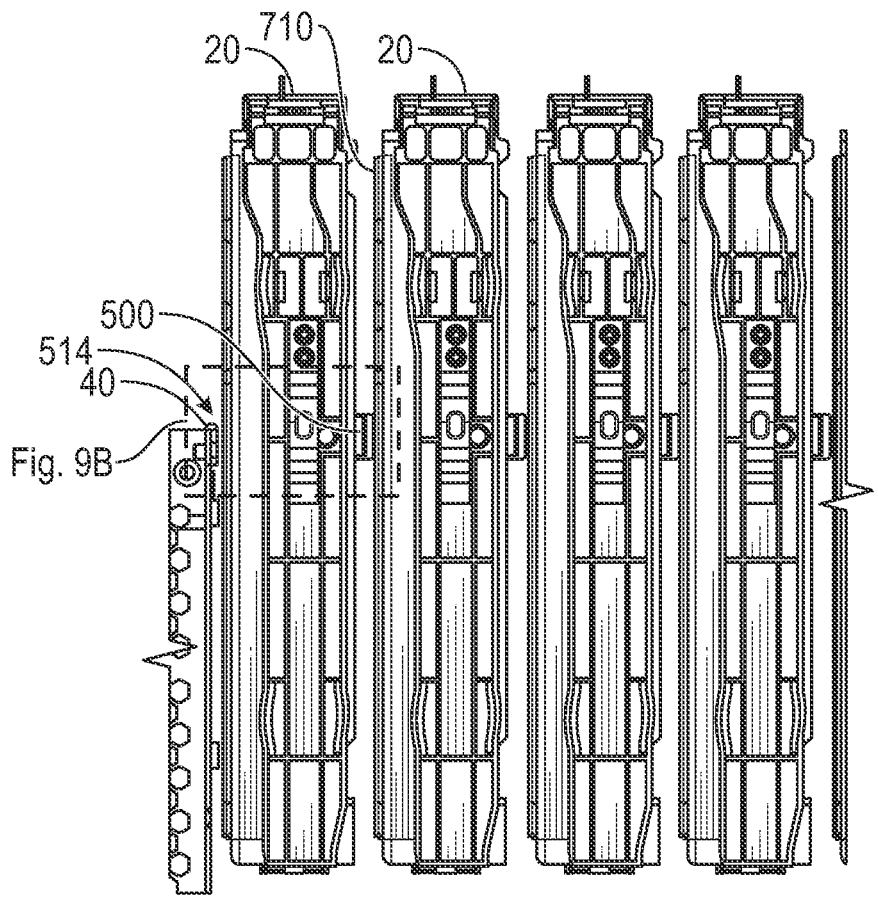
FIGS. 9A and 9B are front, sectional views of an embodiment for reducing improper airflow in a housing.
Figure 9B:
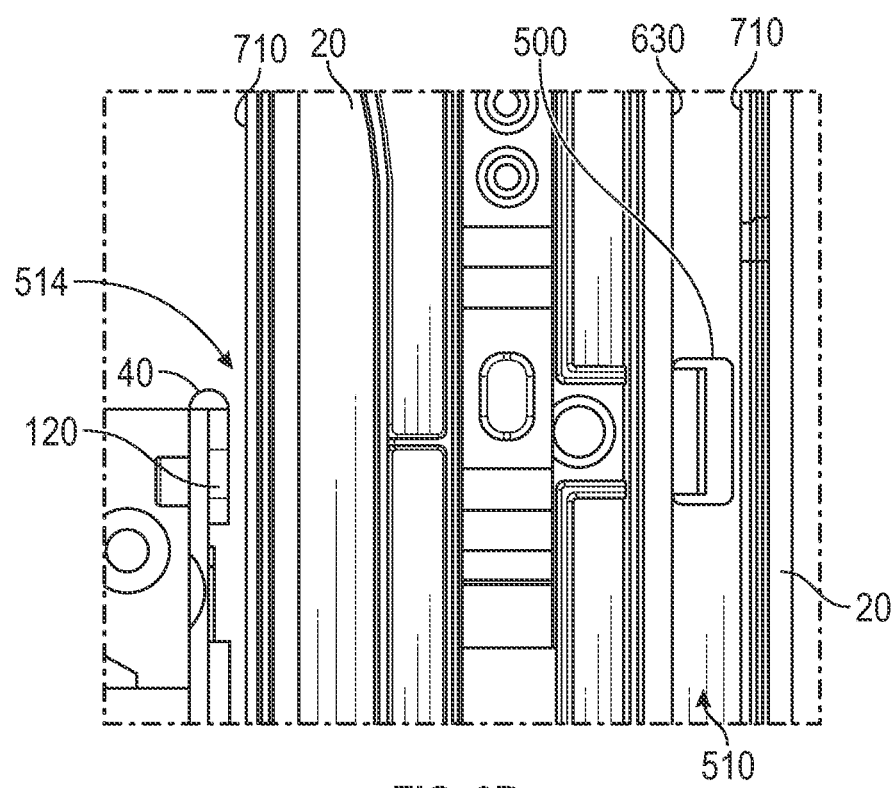

FIGS. 9A and 9B are front, sectional views of an embodiment for reducing improper airflow in a housing. FIG. 9A depicts flow path 514 between device 20 and edge 40. FIG. 9B shows an enlarged section of FIG. 9A. In an embodiment, flow path 514 has been determined to be small enough that a bar between edge 40 and device 20 is not necessary. In an embodiment, a bar 500 may be added and dimensioned to partially or completely eliminate flow path 514.

Figure 10:
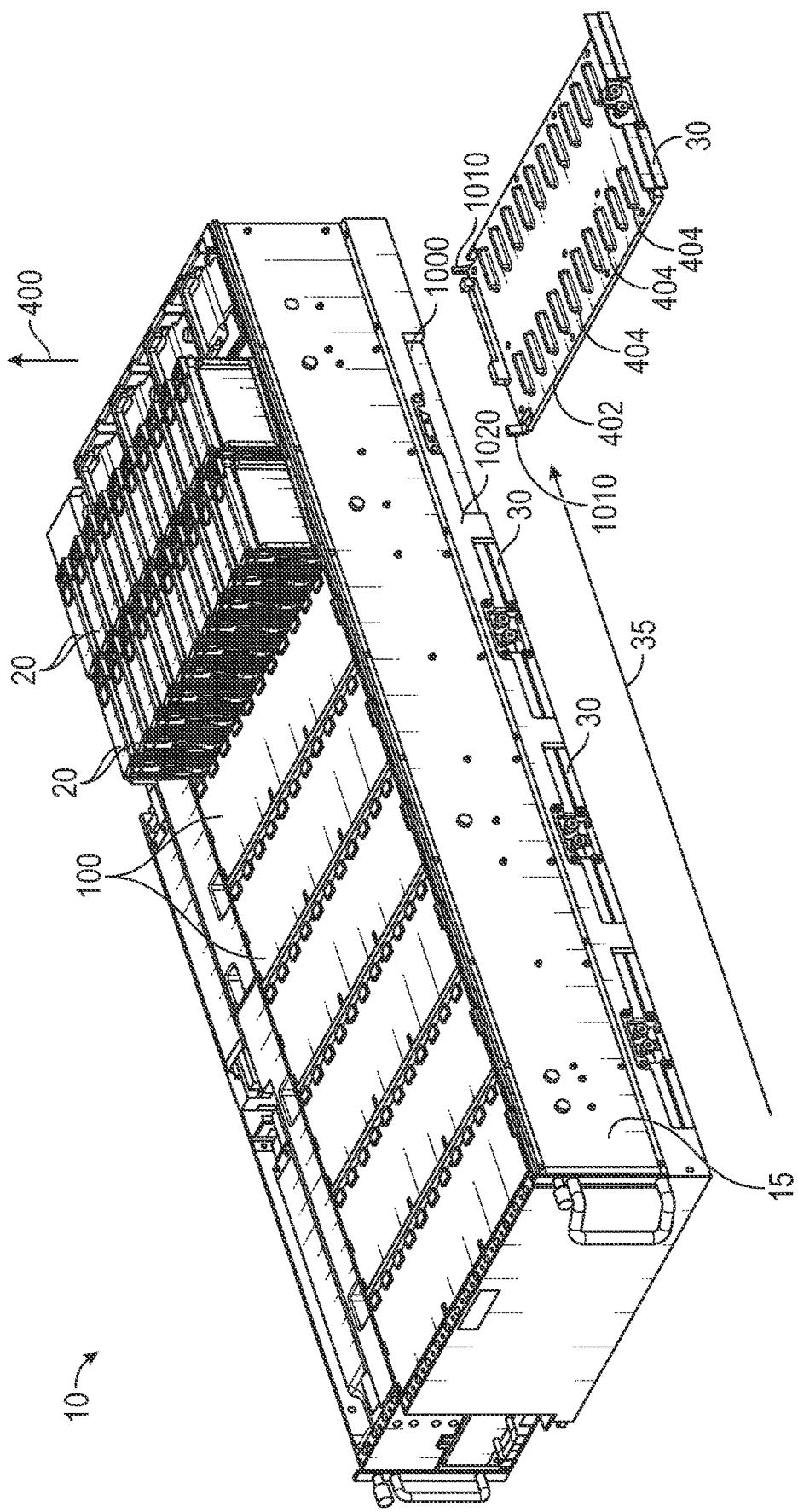
FIG. 10 is a perspective view of an embodiment for reducing improper airflow in a housing.

FIG. 10 is a perspective view of an embodiment for reducing improper airflow in a housing. In FIG. 10, lids 100 have been removed from above two pluralities of devices 20, which have then been raised in direction 400 to disconnect them from circuit board 402. Board 402 has them been removed from slot 1020 in chassis 15. Thus, backplane tray 30 is no longer in position and a chassis opening 1020 is revealed. In other words, the removal of board 402 creates chassis opening 1020 through which an undesired airflow may pass. However, on removal of board 402, a flap 1000 is positioned to block chassis opening 1020. Thus, in the embodiment, chassis 15 is equipped with a flap 1000 that reduces the area of a flow path created by the removal of circuit board 402. Circuit board 402 is shown to be provided with leaf spring 1010, which are elements that initiate contact with the upper part of flap 1000 and facilitate the opening of flap 1000 when board 402 is inserted into chassis opening 1020.

Figure 11A:
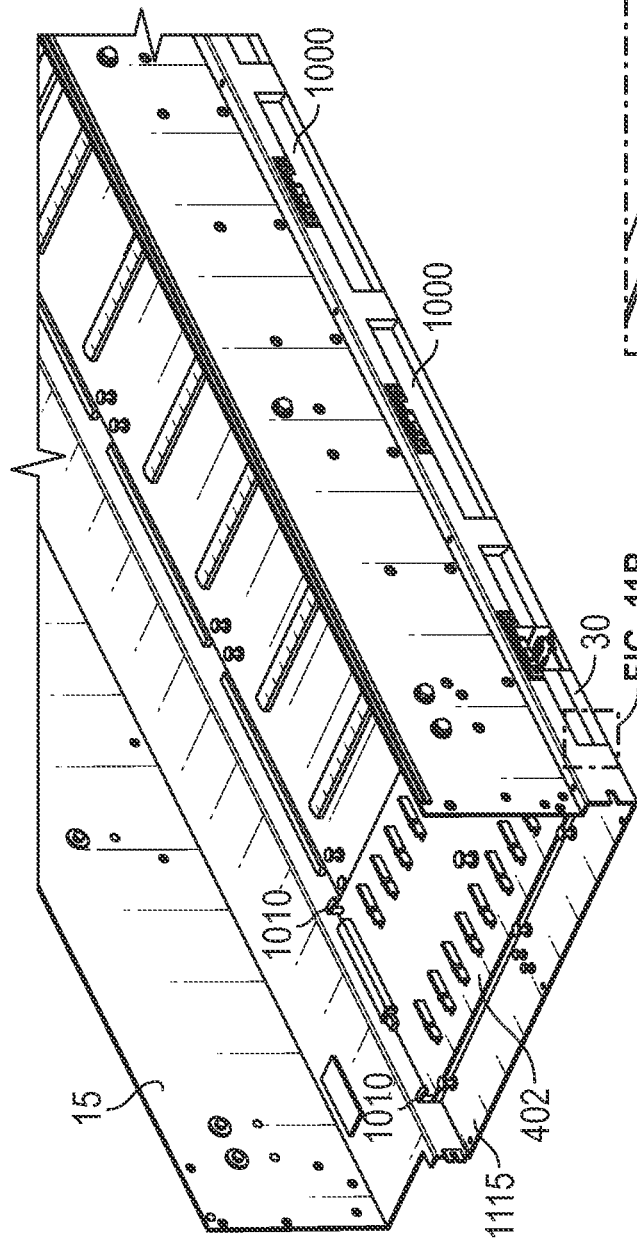
FIGS. 11A and 11B are perspective sectional views of an embodiment for reducing improper airflow in a housing.
Figure 11B:
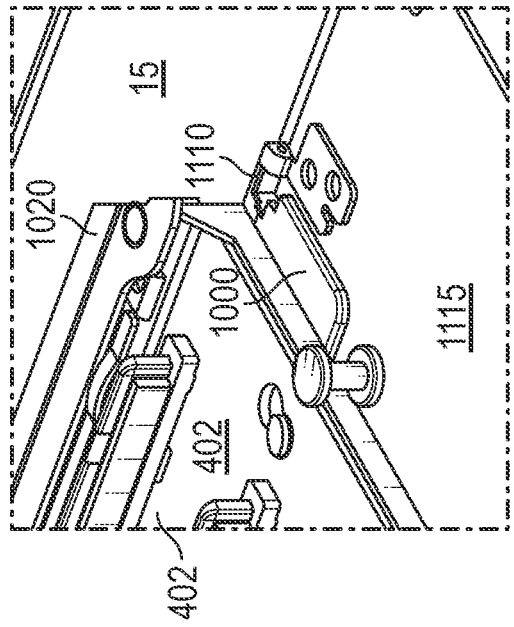

FIGS. 11A and 11B are perspective sectional views of an embodiment for reducing improper airflow in a housing. FIG. 11A illustrates circuit board 402 fully inserted into chassis opening 1020 and along a chassis bottom 1115 such that opening 1020 is covered by backplane tray 30. FIG. 11A further indicates the location (on the external chassis side) of FIG. 11B (which depicts the internal chassis side). In FIG. 11B, flap 1000 is shown to be equipped with a spring-loaded hinge 1110 that biases flap 1000 to the upright position. Biased in this manner, flap 1000 closes chassis opening 1020 upon the removal of circuit board 402. Thus, flap 1000 reduces or eliminates air flow through chassis opening 1020 when circuit board 402 is removed for, e.g., servicing. The end of flap 1000 not shown in FIG. 11B may also be provided with a similar spring-loaded hinge.

Figure 12A:
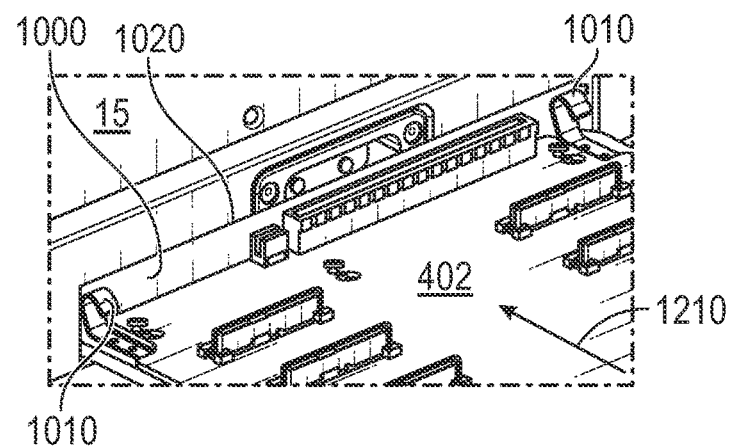
FIGS. 12A, 12B, and 12C are perspective sectional views of an embodiment for reducing improper airflow in a housing.
Figure 12B:
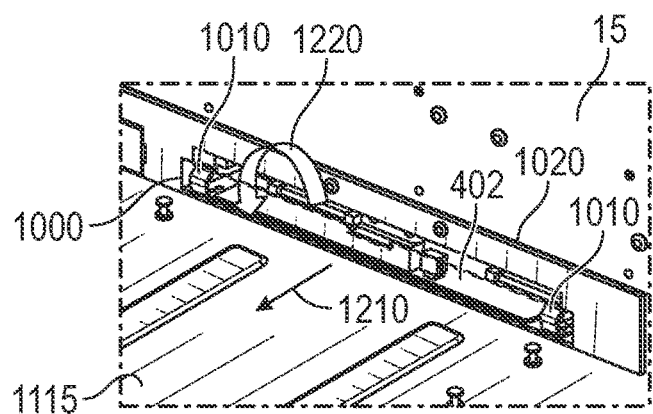
Figure 12C:
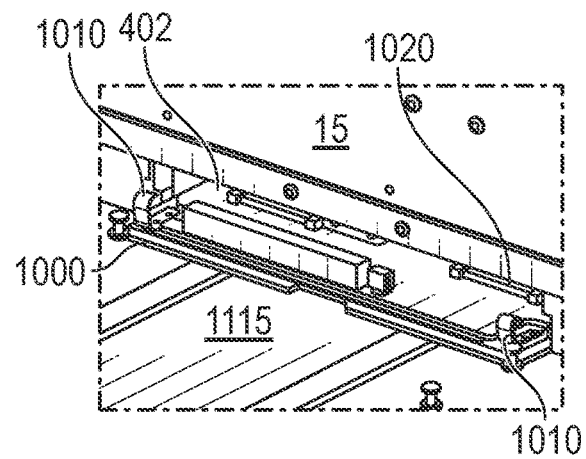

FIGS. 12A, 12B, and 12C are perspective sectional views of an embodiment for reducing improper airflow in a housing. FIGS. 12A-12C illustrate the retraction of flap 1000 caused by the insertion of circuit board 402. In reverse, these same figures illustrate the deployment of flap 1000 caused by the removal of circuit board 402. FIG. 12A is an external view of chassis 15 and show leaf springs 1010 being forced in direction 1210 and at the initial contacting of flap 1000 from the outside. Rams 1010 may be configured to contact flap 1000 at some distance above board 402 to provide increased torque that facilitates rotation of flap 1000 around hinge 1110.

FIG. 12B is an internal view of chassis 15 with flap 1000 partially transparent. FIG. 12B shown ram 1010 abutting flap 1000 and forcing flap 1000 to rotate inward and down 1220 (hinges 1110 are not shown).

FIG. 12C is the view of FIG. 12B after additional insertion of circuit board 402. In FIG. 12C, flap 1000 has been forced flat such that on further insertion circuit board 402 slides over flap 1000 along chassis floor 1115 until it is positioned as shown in FIG. 11A.

In an embodiment, a flap may be located externally on chassis 15. In such an embodiment, the flap may be manually retracted (above or below opening 1020) to permit the insertion of circuit board 402 into chassis opening 1020. On removal of circuit board 402, the flap may be biased to automatically cover chassis opening 1020.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
    a housing including in interior space dimensioned to accept a first plurality of electronic device carriers and a second plurality of electronic device carriers, the housing including
    an opening that provides access to the interior space;
    a fan configured to cause a first flow of air into the interior space through at least one vent disposed in the housing;
    at least one slot providing access into the interior space, each such slot dimensioned to admit a circuit board into the interior space;
    for each slot, a flap configured to cover the slot in a first flap position and not cover the slot in a second flap position;
    a first partition partially defining a device position in the interior space for each electronic device carrier of the first and second plurality of electronic device carriers; and
    first and second lids removably attachable to the first partition, the first lid spanning between two sides of the housing on either side of the positions for the first plurality of electronic device carriers, the second lid spanning between two sides of the housing on either side of the positions for the second plurality of electronic device carriers, wherein, when the housing is not installed and the first and second lids are attached, the first and second lids and any flap in the first flap position cooperate to reduce a second flow of air through the opening and into the interior space, the second flow of air bypassing the at least one vent.

2. The apparatus of claim 1, wherein each flap includes a spring biasing the flap to the first flap position and the flap is retracted into the interior space in the second flap position with the insertion of the circuit board into the interior space.

3. The apparatus of claim 1, wherein the flap retracts away from the interior space to the second flap position.

4. The apparatus of claim 1 further including the first plurality of electronic device carriers, each electronic device carrier provided with a bar on a first side of the electronic device carrier, each bar dimensioned to reduce a gap between the electronic device carrier and an adjacent surface, wherein:
when the housing is not installed, the second lid is attached, the first lid is detached, and the first plurality of electronic device carriers are in the device carrier positions and raised a first distance sufficient to disconnect the electronic devices from the circuit board, the first plurality of electronic device carriers and bars cooperate with the second lid to reduce the second flow of air into the interior space that bypasses the at least one vent.

5. The apparatus of claim 4, wherein, when the first electronic device carriers are raised to the first distance, the bars and the second lid are at a second distance from a plane of the circuit board.

6. The apparatus of claim 1 further including:
    a first plurality of electronic device carriers and a second plurality of electronic device carriers, each electronic device carrier provided with a bar on a first side of the electronic device carrier, each bar dimensioned to reduce a gap between the electronic device carrier and an adjacent surface;
    wherein:
    the interior space is dimensioned to accept the first plurality of electronic device carriers, the second plurality of electronic device carriers, a third plurality of electronic device carriers, and a fourth plurality of electronic device carriers;
    a first at least one slot is dimensioned to provide access to the interior space for a first circuit board associated with the first and second pluralities of electronic device carriers;
    a second at least one slot is dimensioned to provide access to the interior space for a second circuit board associated with the third and fourth pluralities of electronic device carriers;
    a second partition partially defines the device carrier positions of the second plurality of electronic device carriers and a device carrier position for each of the third plurality of electronic device carriers and the second lid is removably attachable to the second partition;
    a third partition partially defines the device carrier positions in the interior space for each of the third plurality of electronic device carriers and a device carrier position for each of the fourth plurality of electronic device carriers;
    a third lid is removably attachable to the second and third partitions and spans between two sides of the housing on either side of the positions for the third plurality of electronic device carriers;
    a fourth lid is removably attachable to the third partition and spans between two sides of the housing on either side of the positions for the fourth plurality of electronic device carriers, wherein:
    when the housing is not installed, the third lid and fourth lid are attached, the first lid and second lid are detached, and the first plurality and second plurality electronic device carriers are in the device positions and raised a first distance sufficient to disconnect the electronic device carriers from the circuit board, the first and second pluralities of electronic device carriers and bars, and any flap in the first flap position, cooperate with the third and fourth lids to reduce the second flow of air into the interior space.

7. The apparatus of claim 6, wherein:
each flap includes a spring biasing the flap to the first flap position and each flap is retracted into the interior space in the second flap position with the insertion of the circuit board into the interior space through the associated slot; and the flap for the first slot is in the first flap position and the first circuit board is not within the interior space.

8. The apparatus of claim 1, the first lid including:
at least two teeth configured to releasably engage corresponding slits in the housing; and
at least one deformable connector configured to engage the first partition.

9. The apparatus of claim 8, wherein the at least one deformable connector is attached to a beam connected to and spanning the first lid.

10. The apparatus of claim 9, wherein, when the at least two teeth and at least one deformable connector are engaged, and the first lid and second lid are attached to the partition, an edge of the first lid aligns with an edge of the second lid.

11. A method of cooling an apparatus during servicing of the apparatus, the method comprising:
creating a first flow of air using at least one exhaust fan, the first flow of air entering at least one vent in the apparatus;
uninstalling the apparatus from a rack, revealing a plurality of lids covering a plurality of electronic device carriers, each electronic device carrier provided with a bar extending from a first side of the electronic device carrier;
detaching lids associated with a subset of the plurality of electronic device carriers;
disconnecting the subset of electronic device carriers from a circuit board;
distancing the subset of electronic device carriers from the circuit board until the bars associated with the subset of electronic device carriers are at a first distance from the circuit board;
removing the circuit board from the apparatus creating a slot in the housing, a flap attached to the apparatus closing the slot on removal of the circuit board, wherein the remaining attached lids, the raised subset of electronic device carriers and bars, and the flap cooperate to reduce a second flow of air into the apparatus, the second flow of air reducing the first flow of air.

12. A kit for an apparatus housing electronic device carriers, the housing including:
an interior space dimensioned to accept a first plurality of electronic device carriers and a second plurality of electronic device carriers, the housing including an opening that provides access to the interior space;
a fan configured to cause a first flow of air into the interior space through at least one vent disposed in the housing; and
at least one slot providing access into the interior space, each such slot dimensioned to admit a circuit board into the interior space;
the kit including:
for each slot, a flap configured to movably attach to the housing and to cover the slot in a first flap position and not cover the slot in a second flap position;
a first partition partially defining a device carrier position in the interior space for each electronic device carrier of the first and second plurality of electronic device carriers; and
first and second lids removably attachable to the first partition, the first lid dimensioned to span between two sides of the housing on either side of the positions for the first plurality of electronic device carriers, the second lid dimensioned to span between two sides of the housing on either side of the positions for the second plurality of electronic device carriers, wherein, when the partition is attached, and the first and second lids are attached, and the cover is removed, the first and second lids and any flap in the first flap position cooperate to reduce a second flow of air into the interior space, the second flow of air bypassing the at least one vent.

13. The kit of claim 12 further including, for each of the first and second pluralities of electronic device carriers, a bar attachable to a side the electronic device carrier, the bar dimensioned to reduce a gap between the electronic device carrier and an adjacent surface, wherein:
when each electronic device carrier is equipped with a bar, the second plurality of electronic device carriers is installed in the housing, the second lid is attached, the housing is not installed, the first lid is detached, and the first plurality of electronic device carriers are in the device carrier positions and raised a first distance sufficient to disconnect the electronic device carriers from the circuit board, the first plurality of electronic device carriers and bars cooperate with the second lid to reduce the second flow of air bypassing the at least one vent.

* * * * *